US005654926A

United States Patent [19]
Kanzaki

[11] Patent Number: 5,654,926
[45] Date of Patent: Aug. 5, 1997

[54] SEMICONDUCTOR MEMORY DEVICE

[75] Inventor: Teruaki Kanzaki, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 605,379

[22] Filed: Feb. 22, 1996

[30] Foreign Application Priority Data

Sep. 7, 1995 [JP] Japan .................................. 7-230170

[51] Int. Cl.⁶ .................................................. G11C 7/00
[52] U.S. Cl. ........................ 365/203; 365/207; 365/208
[58] Field of Search .................................. 365/203, 207, 365/208, 204

[56] References Cited

U.S. PATENT DOCUMENTS

| | | | |
|---|---|---|---|
| 5,434,822 | 7/1995 | Deleganes et al. | 365/203 |
| 5,477,484 | 12/1995 | Nakashima | 365/203 |
| 5,528,544 | 6/1996 | Kohno | 365/207 |

*Primary Examiner*—David C. Nelms
*Assistant Examiner*—Huan Hoang
*Attorney, Agent, or Firm*—Leydig, Voit & Mayer

[57] ABSTRACT

A semiconductor memory device pre-charges the electric potential of a selected bit line up to a predetermined electric potential, and judges the electric potential of the selected bit line on the basis of the predetermined electric potential as a threshold value after the pre-charge. Thereby, a semiconductor memory device capable of being read out at high speed can be realized.

3 Claims, 6 Drawing Sheets

SEMICONDUCTOR MEMORY DEVICE

BACKGROUND OF THE INVENTION

1. Field of the Invention

The present invention relates to a semiconductor memory device the data of which can be read out at high speed.

2. Description of the Prior Art

Figure 4:
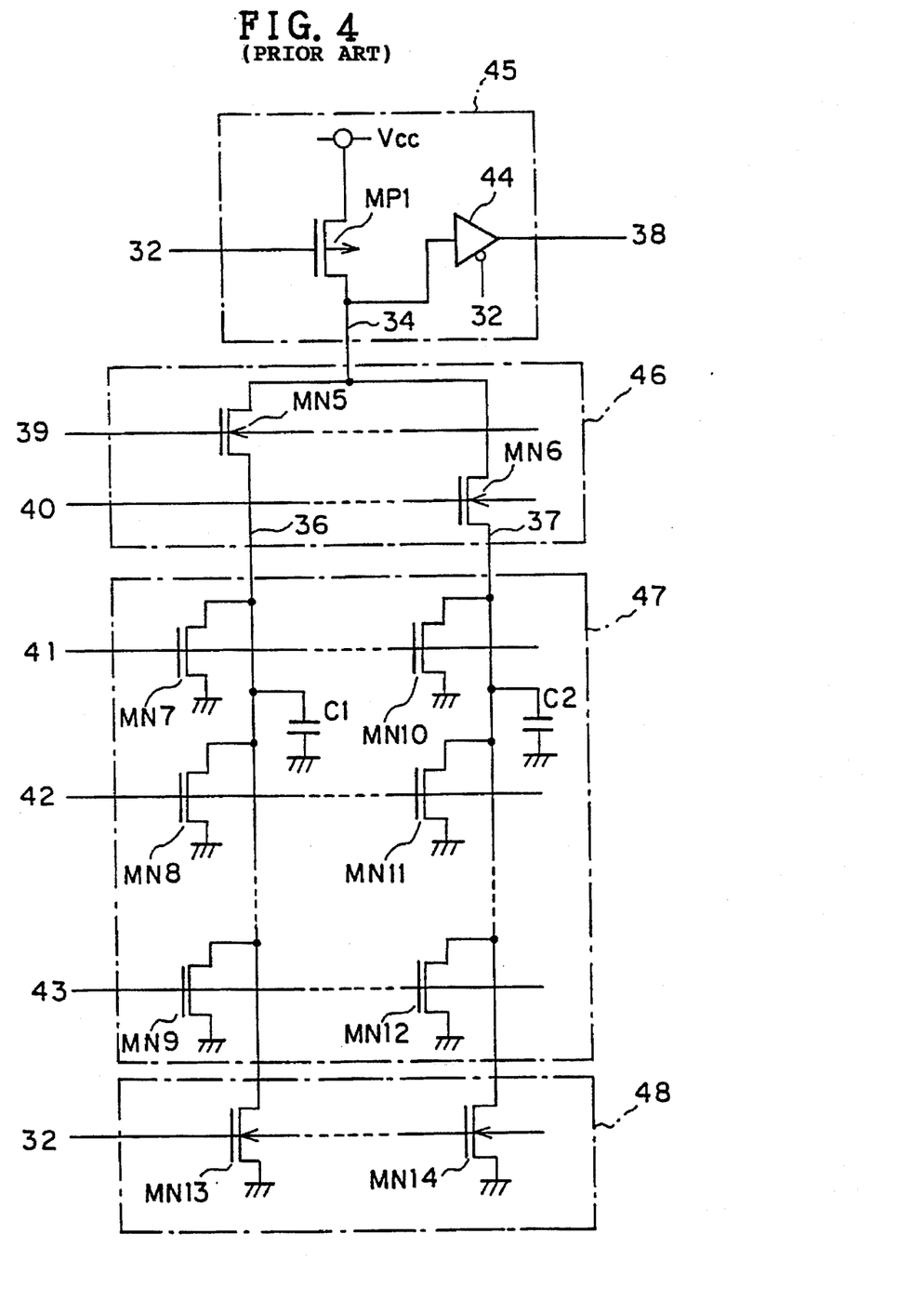
FIG. 4 is a circuit diagram showing a conventional semiconductor memory device.

FIG. 4 is a circuit diagram showing an example of a conventional semiconductor memory device. In the figure, reference numeral 45 denotes a sense amplifier circuit. Reference numeral 46 denotes a selector circuit. Reference numeral 47 denotes a memory cell block. Reference numeral 48 denotes a bit lines grounding circuit.

In the sense amplifier circuit 45, reference letter MP1 denotes a P-channel transistor. Reference numeral 44 denotes a three-state buffer. Reference numeral 32 denotes a memory read out signal line which takes the "L" logic level at the time of reading out the data of the memory cell block 47. Reference numeral 34 denotes an input signal line of the circuit 45. Reference numeral 38 denotes an output line of the circuit 45.

In the selector circuit 46, reference letters MN5 and MN6 denote transistors which are turned on when selector signal lines 39 and 40 take the "H" logic level respectively for connecting bit lines 36 and 37 with sense amplifier circuit 45.

In the memory cell block 47, reference numerals 36 and 37 denote bit lines. Reference numerals 41–43 denote word lines which are properly selected in conformity with address signals input into the memory device and take the "H" logic level in case of being selected and the "L" logic level in case of not selected. Reference letters MN7–MN12 denote N-channel memory transistors (hereinafter simply referred to as memory transistors) which are set to have a high threshold value to the storing information of "1" or a low threshold value to the storing information of "0". Reference letters C1 and C2 denote the stray capacitance of the drain of each memory transistor, the wires of the bit lines 36 and 37, and the like.

In the bit lines grounding circuit 48, reference letters MN13 and MN14 denote N-channel transistors for grounding the bit lines 36 and 37 to fix them at the "L" logic level when the memory read out signal line 32 takes the "H" logic level, and for separating the bit lines 36 and 37 from the ground electric potential when the line 32 takes the "L" logic level.

Next, the operation thereof will be described.

FIG. 5(a) through FIG. 5(h) are timing charts showing a voltage waveform at each part of the memory device when data is read out from the memory transistor MN8, which has a low threshold value, shown in FIG. 4. FIG. 6(a) through FIG. 6(h) are timing charts showing a voltage waveform at each part of the memory device when data is read out from the memory transistor MN11, which has a high threshold value, shown in FIG. 4.

Figure 5A:
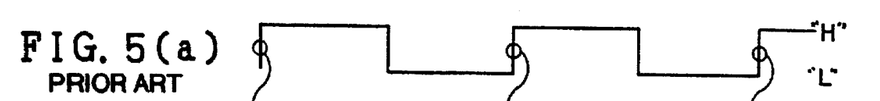
Figure 5B:
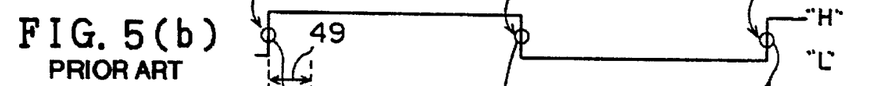
Figure 5C:
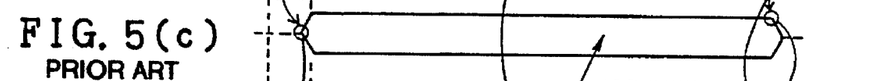
Figure 5D:
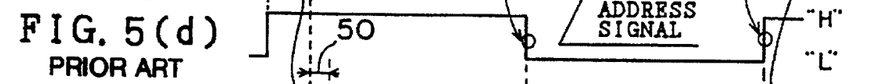
Figure 5E:
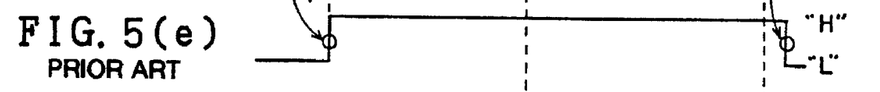
Figure 5F:
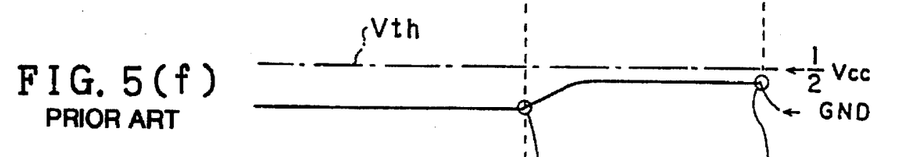
Figure 5G:
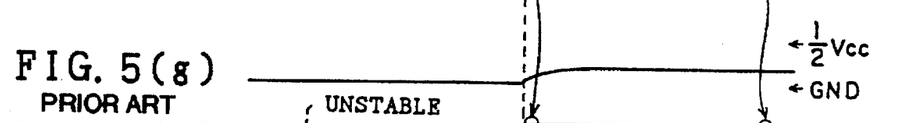
Figure 5H:
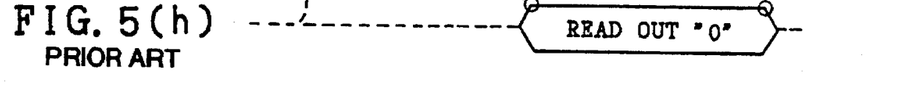
Figure 6A:
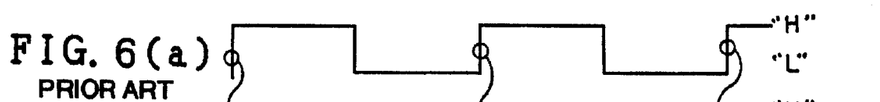
Figures 6B, 6C:
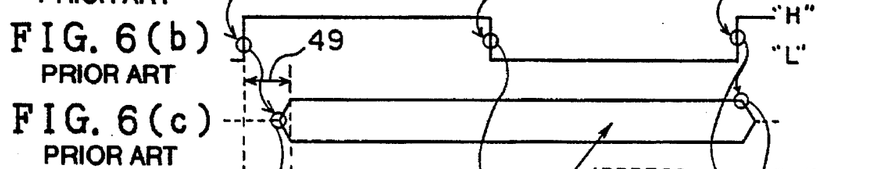
Figure 6D:
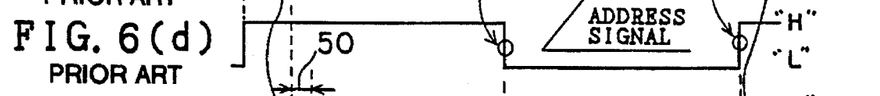
Figures 6E, 6F:
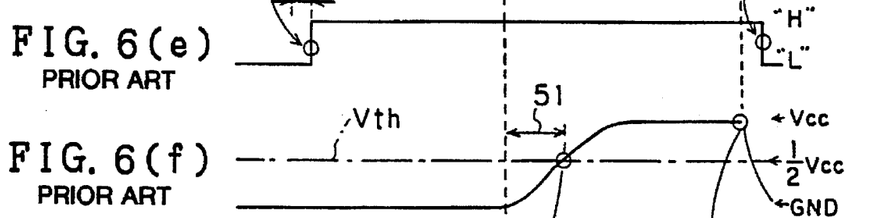
Figure 6G:
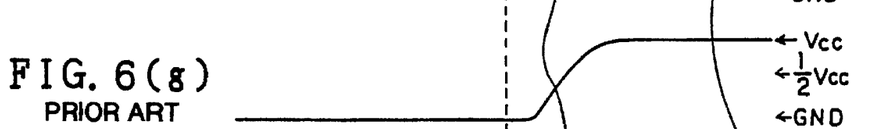
Figure 6H:
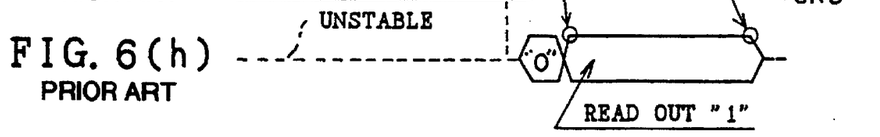

In FIG. 5(a) through FIG. 5(h) and FIG. 6(a) through FIG. 6(h), FIG. 5(a) and FIG. 6(a) show a reference clock signal 30 input into the memory device; FIG. 5(b) and FIG. 6(b) show a divided clock signal 31 obtained by dividing the frequency of the reference clock signal 30 into two; FIG. 5(c) and FIG. 6(c) show the electric potential of an address signal; FIG. 5(d) and FIG. 6(d) show the electric potential of the memory read out signal line 32; FIG. 5(e) shows the electric potential of the word line 42 and the selector signal line 39; FIG. 6(e) shows the electric potential of the word line 42 and the selector signal line 40; FIG. 5(f) and FIG. 6(f) show the electric potential of the input signal line 34 of the sense amplifier circuit 45; FIG. 5(g) shows the electric potential of the bit line 36; FIG. 6(g) shows the electric potential of the bit line 37; FIG. 5(h) and FIG. 6(h) show the electric potential of the output line 38 of the sense amplifier circuit 45.

Address signals input into the memory device are supposed to be fixed at the time of the rising of the divided clock signal 31. The electric potential of the memory read out signal 32 is supposed to turn to the "L" logic level during a period of the "L" logic level of the divided clock signal 31.

When the divided clock signal 31 turns to the "H" logic level, an input address signal is fixed, and by decoding the fixed address signal the selector signal line 39 or 40 is selected to turn to the "H" logic level. At the same time, one of the word lines 41, 42 and 43 is selected to turn to the "H" logic level. In accordance with the selection of the word lines, a memory transistor to be read out is selected. As stated before, if the threshold value of the selected transistor is low, the electric potential of the bit line becomes the "L" logic level; if the threshold value is high, the electric potential becomes floating.

Next, the read-out operation of data stored in the memory transistor MN8 having a low threshold value will be described with reference to FIG. 4 and FIG. 5. At first, when the divided clock signal 31 turns to the "H" logic level, the electric potential of the memory read out signal line 32 turns to the "H" logic level, and the transistors MN13 and MN14 of the bit lines grounding circuit 48 are turned on. Consequently, the electric potential of the bit lines 36 and 37 turns to the "L" logic level. By decoding the address signal input into the memory device, the word line 42 is selected after an address delay time 49 and the delay time of the word line and the selector signal line 50 from the rising of the divided clock signal 31, and the gates of the memory transistors MN8 and MN11 connected to the word line 42 turns to the "H" logic level. As the result of this, the memory transistor MN8 is turned on owing to its low threshold value, and the memory transistor 11 is turned off owing to its high threshold value. Moreover, by decoding the address signal the selector signal line 39 is selected to turn to the "H" logic level similarly, and thereby the bit line 36 is connected to the input signal line 34 of the sense amplifier circuit 45.

At this time, in the sense amplifier circuit 45, since the electric potential of the memory read out signal line 32 is at the "H" logic level, the P-channel transistor MP1 is turned off. Consequently, the electric potential of the input signal line 34 of the circuit 45 takes the electric potential of the bit line 36 or the "L" logic level.

Next, when the divided clock signal 31 turns to the "L" logic level, the memory read out signal line 32 turns to the "L" logic level. Consequently, the transistors MN13 and MN14 in the bit lines grounding circuit 48 are turned off, and thereby the electric potential of the bit lines 36 and 37 tends to be determined in conformity with the states of the memory transistors MN8 and MN11, and the P-channel transistor MP1 in the sense amplifier circuit 45 is turned on at the same time to raise the electric potential of the input signal line 34 of the circuit 45. On the other hand, since the memory transistor MN8 having a low threshold value, which is selected by the word line 42 and the selector signal line 39, has been turned on at that time, the bit line 36 tends to take the ground electric potential, and thereby the electric potential of the input signal line 34 connected to the bit line 36 is limited to the electric potential not exceeding ½* Vcc (the threshold value of the three-state buffer 44), which potential is determined by the driving ability of the P-channel transistor MP1, the driving ability of the memory transistor MN8 and the discharge capacitance of the stray capacitance C1. As the result of that, "0" is read out on the output line 38 of the sense amplifier circuit 45.

Next, the read-out operation of data stored in the memory transistor MN11 having a high threshold value will be described with reference to FIG. 4 and FIG. 6. The operation from the turning to the "H" logic level of the divided clock signal 31 until the turning to the "L" logic level thereof is the same as that in case of FIG. 5 except for the turning to the "H" logic level of the selector signal line 40 to connect the bit line 37 to the input signal line 34 of the sense amplifier circuit 45.

When the divided clock signal 31 turns to the "L" logic level from the "H" logic level, the electric potential of the input signal line 34 of the circuit 45 rises similarly in case of FIG. 5, but since the memory transistor MN11 having a high threshold value, which is selected by the word line 42 and the selector signal line 40, has been turned off at that time, the bit line 37 takes a floating state. As the result of that, the electric potential of the input signal line 34 connected to the bit line 37 rises from the "L" logic level up to a power supply voltage Vcc through the P-channel transistor MP1, which has been turned on. Therefore, correct data, "1", is read out from the output of the three-state buffer 44 after "0" was read out transiently.

As stated before, in the conventional semiconductor memory device, information is preserved by means of memory transistors having a low threshold value and memory transistors having a high threshold value, and a word line and a selector signal line are selected by inputting an address signal and a memory read out signal, and further the information of a properly appointed memory transistor is read out as an output signal by sensing by means of the sense amplifier circuit.

In an aforementioned series of operations of reading out data from the memory device, a control circuit, not shown, of the memory device executes the generation of the divided clock signal 31 by dividing the frequency of the reference clock signal 30, the outputting of a memory read out signal, the selection of a word line by decoding an address signal, the output of a selector signal by decoding the address signal, and the like.

Since the conventional semiconductor memory device is constructed as described above, the electric potential of the input signal line 34 of the sense amplifier circuit 45 is fixed to the "L" logic level while the memory read out signal line 32 is taking the "H" logic level. Consequently, a predetermined electric potential arrival time 51 from the time when the memory read out signal line 32 is inverted from the "H" logic level to the "L" logic level up to the time when the electric potential of the input signal line 34 exceeds ½* Vcc, the threshold value of the three-state buffer 44, is required. Since the predetermined electric potential arrival time 51 is long, the conventional memory device has a problem that the speed for reading out the data stored in the device is slow.

On the other hand, if the memory capacity of a memory device is intended to be increased, the memory capacity is generally increased by increasing memory transistors connected to bit lines, and by increasing word lines selected by decoding address signals. But, if the number of memory transistors connected to bit lines is increased, the stray capacitance denoted by C1 and C2 in FIG. 4 is increased, and then the predetermined electric potential arrival time 51 of the input signal line 34 is elongated. Consequently, the speed of reading out data stored in the memory device becomes slow, and therefore the number of memory transistors connectable to a bit line is restricted. The conventional memory device consequently has a problem that it must enlarge the area for the layout of the circuit elements thereof because it is required to increase further sense amplifier circuits, selector circuits and bit lines grounding circuits for increasing the memory capacity of the device.

Furthermore, it can be considered to increase the frequency of the reference clock signal 30 for increasing the speed of reading out the data of the memory device. The aforementioned address delay time 49 and the delay time of the word line and the selector signal line 50 can be not fixed by the time when the divided clock signal 31 turns to the "L" logic level, and therefore they have enough time even if the frequency of the reference clock signal is increased. But, when "1" is read out, namely when the output of the sense amplifier circuit 45 is "1", since the predetermined electric potential arrival time 51 of the input signal line 34 is long, "0" is erroneously read out before the electric potential of the input signal line 34 reaches the threshold value of the three-state buffer 44 if the frequency of the reference clock signal 30 is increased. Consequently, the frequency cannot be increased. It can also be considered to shorten the predetermined electric potential arrival time 51 by improving the driving ability of the P-channel transistor MP1 instead of increasing the frequency of the. reference clock signal 30. But, if such is realized, there happens a problem that the electric potential of the input signal line 34 becomes higher than the threshold value of the three-state buffer 44 in the case where "0" is read out, and then the read out value erroneously takes "1" consequently.

SUMMARY OF THE INVENTION

In view of the foregoing, it is an object of the present invention to provide a semiconductor memory device capable of being read out at high speed, namely the read-out speed of which does not decrease while the increase of the area for the layout of the circuit elements thereof is maintained at a minimum, even if the number of memory transistors connected to a sense amplifier circuit is increased for enlarging the memory capacity of the memory device.

According to the first aspect of the present invention, for achieving the above-mentioned objects, there is provided a semiconductor memory device which pre-charges the electric potential of a selected bit line up to predetermined electric potential, and judges the electric potential of the selected bit line on the basis of the predetermined electric potential as a threshold value after the pre-charge.

According to the second aspect of the present invention, there is provided a semiconductor memory device, wherein the pre-charging means thereof, which pre-charges the electric potential of a selected bit line up to predetermined electric potential, comprises a first switching circuit for fixing bit lines at ground electric potential for a first predetermined period and for separating the bit lines from the ground electric potential after the first predetermined period, a second switching circuit for connecting a second bit line to a power supply during the first predetermined period, second memory cells provided at intersections of word lines and the second bit line and having a substantially same size as that of memory cells provided at intersections of the word lines and the bit lines, and a connecting circuit for connecting the selected bit line with the second bit line during a second predetermined period following after the first predetermined period.

According to the third aspect of the present invention, there is provided a semiconductor memory device, wherein the transistor thereof, which connects a selected bit line to a power supply after separating the pre-charging means thereof from the selected bit line, has driving ability to lower the electric potential of the selected bit line than predetermined electric potential in case of reading out one of binary information after the bit line has connected with the power supply.

According to the fourth aspect of the present invention, there is provided a semiconductor memory device, wherein each of a plurality of memory cells provided at the intersections of word lines and bit lines is an N-channel MOS (Metal Oxide Semiconductor) transistor having a grounded source, a drain connected to any of the bit lines, and a gate connected to any of the word lines, and having a threshold value set to be low in case of storing information of "0" or high in case of storing information of "1".

BRIEF DESCRIPTION OF THE DRAWINGS

Further objects and advantages of the present invention can be more fully understood from the following detailed description taken in conjunction with the accompanying drawings, in which:

FIG. 2(a)–FIG. 2(j) are waveform diagrams waveform of the electric potential of each part of the circuit shown in FIG. 1 in case of reading out "0";

FIG. 3(a)–FIG. 3(j) are waveform diagrams showing the waveform of the electric potential of each part of the circuit shown in FIG. 1 in case of reading out "1";

FIG. 5(a)–FIG. 5(h) are waveform diagrams showing the waveform of the electric potential of each part of the circuit shown in FIG. 4 in case of reading out "0"; and FIG. 6(a)–FIG. 6(h) are waveform diagrams showing the waveform of the electric potential of each part of the circuit shown in FIG. 4 in case of reading out "1".

DETAILED DESCRIPTION OF A PREFERRED EMBODIMENT

A preferred embodiment of the present invention will now be described in detail with reference to the accompanying drawings.

Figure 1:
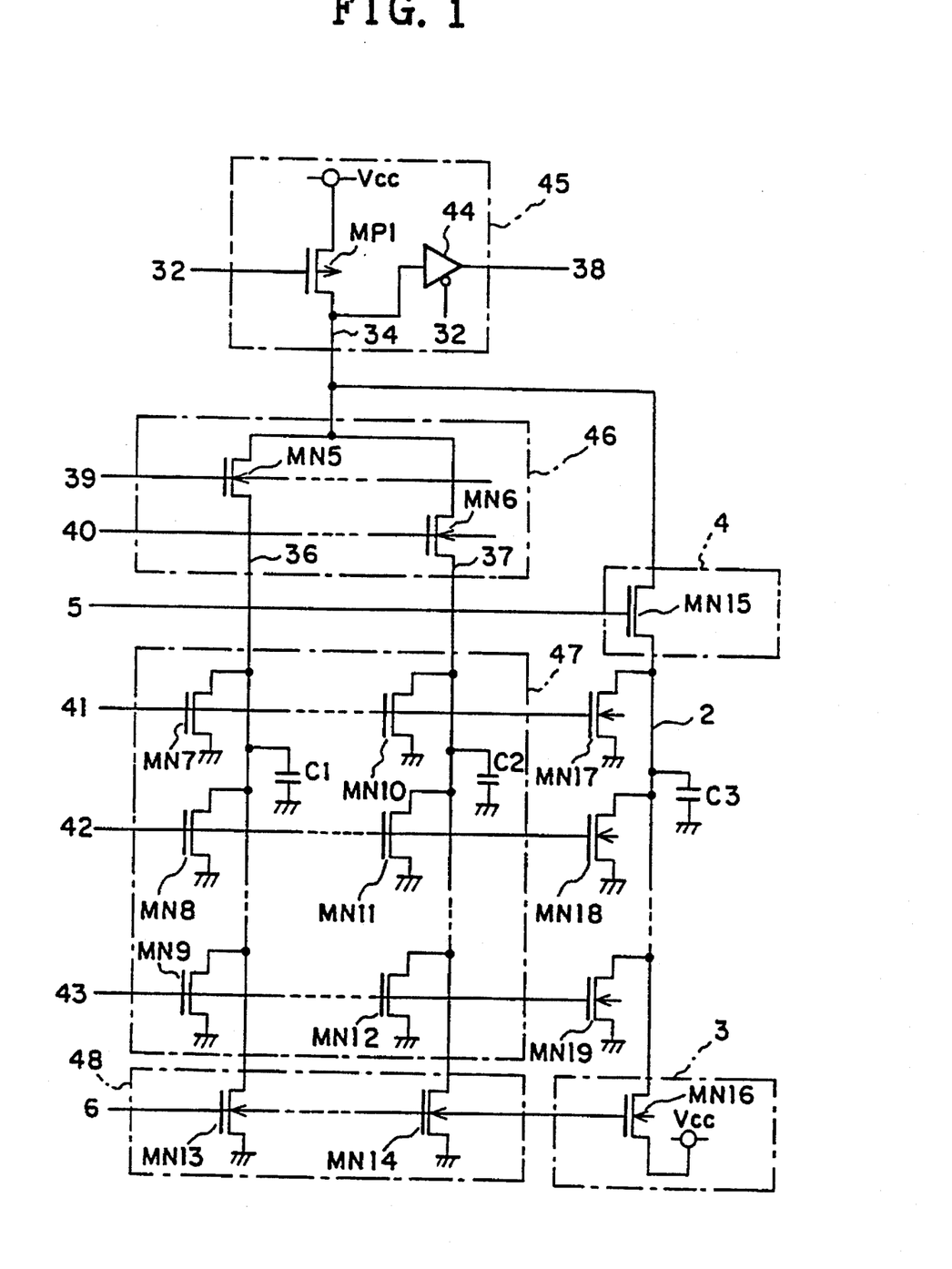
FIG. 1 is a circuit diagram showing a semiconductor memory device according to an embodiment of the present invention.

FIG. 1 is a circuit diagram showing a semiconductor memory device according to an exemplary embodiment of the present invention. In FIG. 1, the same parts as those of the conventional circuit shown in FIG. 4 are denoted by the same reference numerals. Reference numeral 45 denotes a sense amplifier circuit. Reference numeral 46 denotes a selector circuit (or a bit line selecting circuit). Reference numeral 47 denotes a memory cell block. Reference numeral 48 denotes a bit lines grounding circuit (or a first switching circuit).

In the sense amplifier circuit 45, reference letter MP1 denotes a P-channel transistor. Reference numeral 44 denotes a three-state buffer. Reference numeral 32 denotes a memory read out signal line which takes the "L" logic level at the time of reading out the data of the memory cell block 47. Reference numeral 34 denotes an input signal line of the sense amplifier circuit 45. Reference numeral 38 denotes an output line of the sense amplifier circuit 45.

In the selector circuit 46, reference letters MN5 and MN6 denote transistors which are turned on when selector signal lines. 39 and 40 take the "H" logic level respectively for connecting bit lines 36 and 37 with sense amplifier circuit 45.

In the memory cell block 47, reference numerals 36 and 37 denote bit lines. Reference numerals 41–43 denote word lines which are properly selected in conformity with address signals input into the memory device and take the "H" logic level in case of being selected and the "L" logic level in case of not being selected. Reference letters MN7–MN12 denote N-channel MOS transistors (or memory cells) which are set to have a high threshold value to the storing information of "1" or a low threshold value to the storing information of "0". Reference letters C1 and C2 denote the stray capacitance of the drain of each memory transistor, the wires of the bit lines 36 and 37, or the like.

In the bit lines grounding circuit 48, reference letters MN13 and MN14 denote N-channel transistors for grounding the bit lines 36 and 37 to fix them at the "L" logic level when a control signal line 6 takes the "H" logic level, and for separating the lines 36 and 37 from the ground electric potential when the line 6 takes the "L" logic level.

Reference numeral 2 denotes a second bit line separated from the bit lines 36 and 37, which is provided in the present embodiment. Reference numeral 3 denotes a switching circuit (or a second switching circuit) for connecting the second bit line 2 to a power supply voltage at the time of reading out data from the memory device. Reference letters MN17–MN19 denote second memory transistors (or second memory cells) provided at the intersections of the word lines 41–43 and the second bit line 2, and having a substantially same size as that of the memory transistors MN7–MN12 connected to the word lines 41–43. Reference numeral 4 denotes a connecting circuit for connecting the second bit line 2 with the bit line 36 or 37 selected by the selector circuit 46. Reference letter MN15 denotes an N-channel transistor comprising the connecting circuit 4. Reference letter MN16 denotes an N-channel transistor comprising the switching circuit 3, whose Gate is connected to the control signal line 6. Reference numeral 5 denotes a control signal line for controlling the N-channel transistor MN15. Reference letter C3 denotes the stray capacitance of the second bit line 2. Since the number of the memory transistors MN7–MN9 or MN10–MN12 connected to the bit lines 36 or 37 respectively and the number of the second memory transistors MN17–MN19 are the same, the stray capacitance C3 of the bit line 2 is almost the same as the stray capacitance C1 or C2 of the respective bit line 36 or 37. The bit lines grounding circuit 48, the second bit line 2, the switching circuit 3, the connecting circuit 4 and the second memory transistors MN17–MN19 comprise a pre-charging means for pre-charging the electric potential of a bit line selected by the selector circuit 46 up to ½* Vcc, the threshold value of the three-state buffer 44.

Next, the operation thereof will be described.

FIG. 2(a) through FIG. 2(j) are timing charts showing a voltage waveform at each part of the memory device when data are read out from the memory transistor MN8 which has a low threshold value. FIG. 3(a) through FIG. 3(j) are timing charts showing a voltage waveform at each part of the memory device when data are read out from the memory transistor MN11 which has a high threshold value.

Figures 2A, 2J:
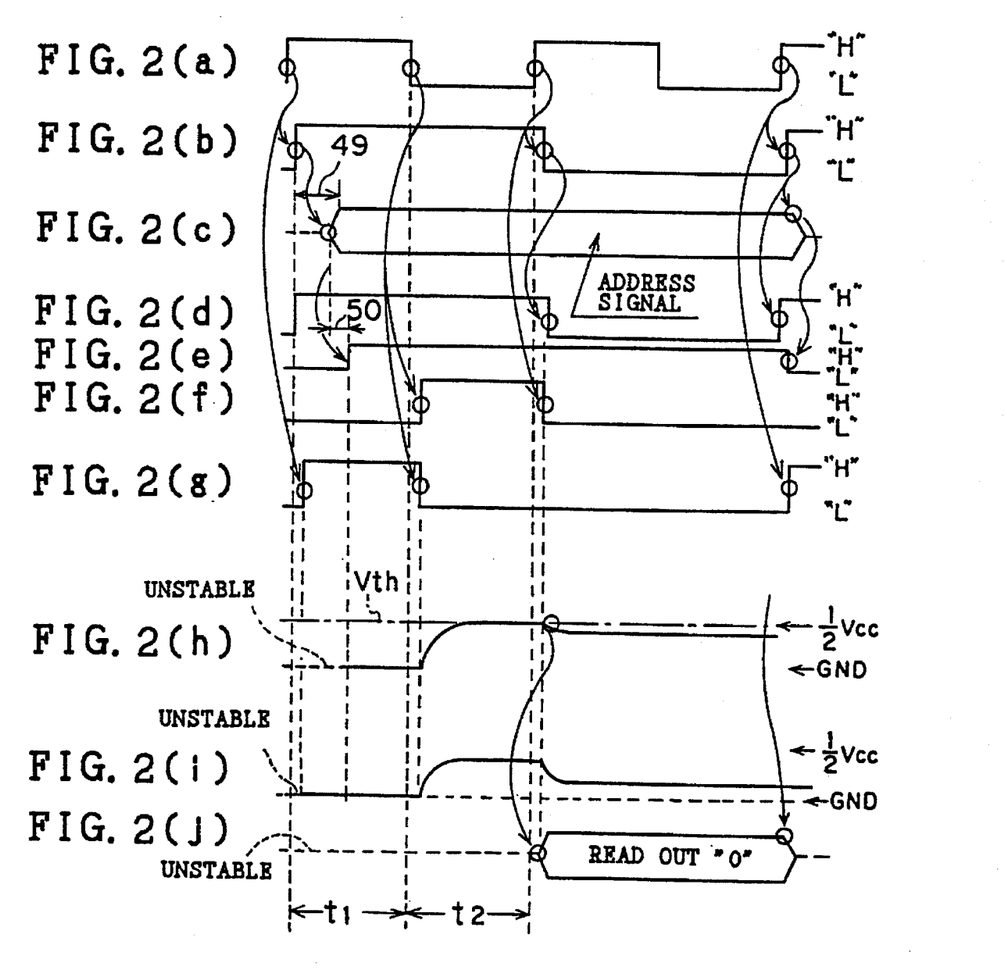
Figures 3A, 3J:
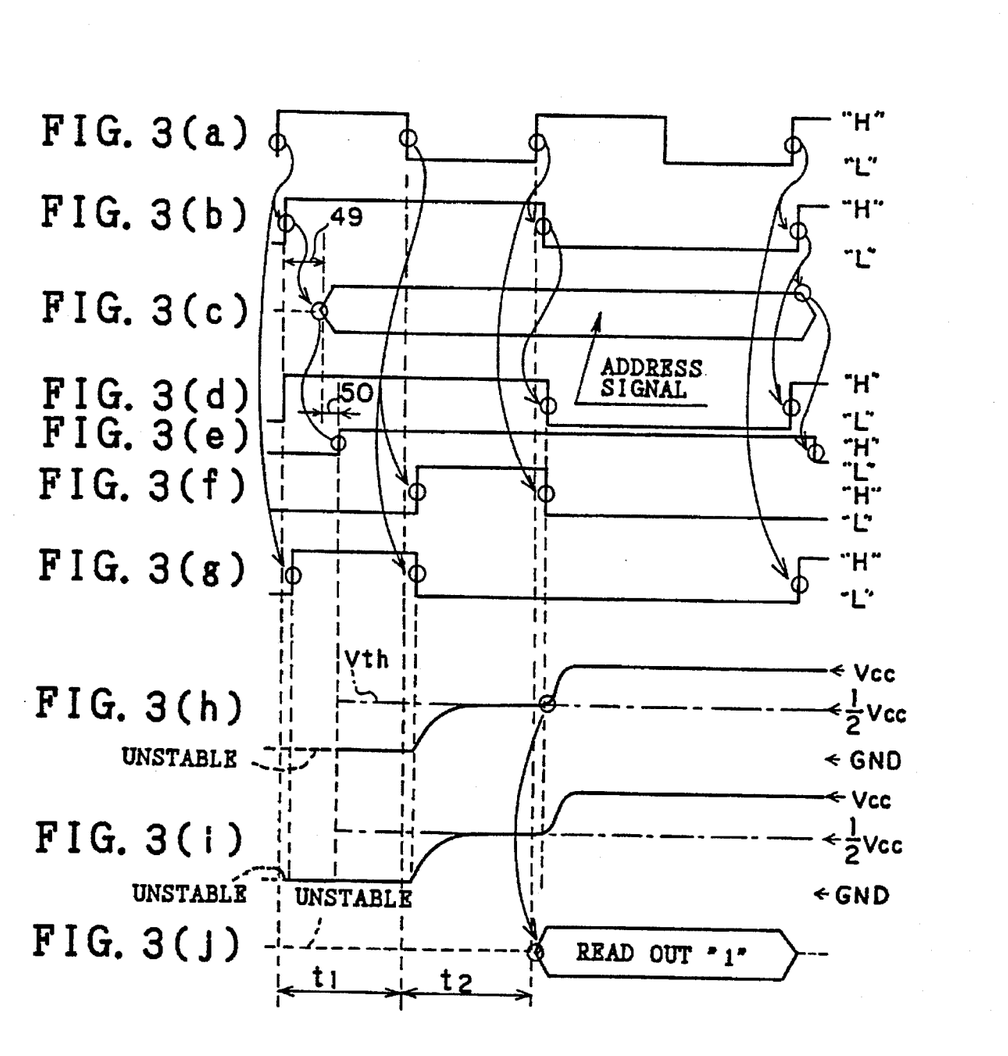

In FIG. 2(a) through FIG. 2(j) and FIG. 3(a) through FIG. 3(j), FIG. 2(a) and FIG. 3(a) show a reference clock signal 30 input into the memory device; FIG. 2(b) and FIG. 3(b)

show a divided clock signal 31 obtained by dividing the frequency of the reference clock signal 30 into two; FIG. 2(c) and FIG. 3(c) show the electric potential of address signal; FIG. 2(d) and FIG. 3(d) show the electric potential of the memory read out signal line 32; FIG. 2(e) shows the electric potential of the word line 42 and the selector signal line 39; FIG. 3(e) shows the electric potential of the word line 42 and the selector signal line 40; FIG. 2(f) and FIG. 3(f) show the electric potential of the control signal line 5 for controlling the turning on or off of the N-channel transistor MN15 composing the connecting circuit 4; FIG. 2(g) and FIG. 3(g) show the electric potential of the control signal line 6 for controlling the transistors MN13 and MN14 in the bit lines grounding circuit 48 and the transistor MN16 in the switching circuit 3; FIG. 2(h) and FIG. 3(h) show the electric potential of the input signal line (or a selected bit line) 34; FIG. 2(i) shows the electric potential of the bit line 36; FIG. 3(i) shows the electric potential of the bit line 37; FIG. 2(j) and FIG. 3(j) show the electric potential of the output line 38 of the sense amplifier circuit 45.

At first, the operations common to the cases of reading out "0" and "1" will be described with reference to FIG. 1, FIG. 2(a)–FIG. 2(j) and FIG. 3(a)–FIG. 3(j). Address signals input into the memory device are supposed to be fixed at the time of the rising of the divided clock signal 31 similarly in the conventional circuit shown in FIG. 4. When the divided clock signal 31 takes the "H" logic level and the reference clock signal 30 takes the "H" logic level (the period $t_1$ in FIG. 2(a)–FIG. 2(j) and FIG. 3(a)–FIG. 3(j)), the transistor MN16 in the switching circuit 3 is turned on together with the turn-on of the transistors MN13 and MN14 in the bit lines grounding circuit 48 by turning the electric potential of the control signal line 6 to the "H" logic level in accordance with the rising of the reference clock signal 30. By the turn-on of the transistors MN13 and MN14 the electric potential of the bit lines 36 and 37 turns to the "L" logic level to discharge the stray capacitance C1 and C2. The turn-on of the transistor MN16 connects the second bit line 2 to the power supply to charge the stray capacitance C3 up to the power supply voltage Vcc.

In this state, the word line 42 is selected by decoding an address signal input into the memory device after the address delay time 49 and the delay time of the word line and the selector signal line 50 from the rising of the divided clock signal 31. Then, the gates of the memory transistors MN8 and MN11 connected to the word line 42 turn to the "H" logic level. However, the electric potential of the bit lines 36 and 37 is fixed to the "L" logic level regardless of the threshold values of the transistors MN8 and MN11 while the electric potential of the control signal line 6 is taking the "H" logic level during the period $t_1$.

On the other hand, the selector signal line 39 or 40 is selected to turn to the "H" logic level by decoding the address signal after an address delay time 49 and the delay time of the word line and the selector signal line 50 from the rising of the divided clock signal 31, and thereby the selected bit line 36 or 37 is connected to the input signal line 34 of the sense amplifier circuit 45. Since the electric potential of the memory read out signal line 32 is at the "H" logic level during the period $t_1$, the P-channel transistor MP1 in the sense amplifier circuit 45 is being turned off. Consequently, the electric potential of the input signal line 34 of the circuit 45 takes the same electric potential as that of the bit line 36 or 37, namely the "L" logic level.

Next, when the reference clock signal 30 turns to the "L" logic level while the divided clock signal 31 is at the "H" logic level (or the period $t_2$ in FIG. 2(a)–FIG. 2(j) and FIG. 3(a)–FIG. 3(j)), the control signal line 5 turns to the "H" logic level and the control signal line 6 turns to the "L" logic level. By the turning to the "H" logic level of the control signal line 6, the transistors MN13 and MN14 in the bit lines grounding circuit 48 are turned off, and the transistor MN16 in the switching circuit 3 is also turned off. By the turn-off of the transistors MN13 and MN14, the electric potential of the bit lines 36 and 37 tends to be determined in conformity with the threshold values of the memory transistors MN8 and MN11 each selected by the word line 42. Since the transistor MN8 is turned on owing to its low threshold value, the electric potential of the bit line 36 becomes the "L" logic level; since the transistor MN11 is turned off owing to its high threshold value, the electric potential of the bit line 37 becomes floating. Since the transistor MN15 in the connecting circuit 4 is turned on by the turning to the "H" logic level of the control signal line 5, the second bit line 2 is connected to the input signal line 34. At that time, the stray capacitance C1 or C2 of the selected bit line is connected to the stray capacitance C3 of the second bit line 2. Since the stray capacitance C1 and C2 was discharged and the stray capacitance C3 was charged in the aforementioned operations, the electric potential of the input signal line 34 becomes almost ½* Vcc by the movement of electric charges from the stray capacitance C3 to the stray capacitance C1 or C2.

When the divided clock signal 31 turns to the "L" logic level after the period $t_2$, the control signal line 5 turns to the "L" logic level; thereby, the transistor MN15 is turned off to separate the input signal line 34 from the second bit line 2. Since the memory read out signal line 32 also turns to the "L" logic level when the divided clock signal 31 turns to the "L" logic level, the P-channel transistor MP1 in the sense amplifier circuit 45 is turned on.

If "0" is read out in the state in which the P-channel transistor MP1 has been turned on, since the selector signal line 39 is at the "H" logic level as shown in FIG. 2(e), the P-channel transistor MP1, the transistor MN5 and the memory transistor MN8 are connected in series. Since the memory transistor MN8 has been turned on, the electric potential of the input signal line 34 and the bit line 36 takes the electric potential which is determined in conformity with the resistors of the transistors between the power supply voltage Vcc and the ground voltage. In the present embodiment, the drive ability of the P-channel transistor MP1 is previously determined so that the electric potential of the input signal line 34 of the sense amplifier circuit 45 becomes a little lower than ½* Vcc. Since the electric potential of the input signal line 34 is pre-charged to ½* Vcc, the threshold value of the three-state buffer 44 in the sense amplifier circuit 45, "0" is immediately read out from the output 38 of the circuit 45 if the electric potential of the input signal line 34 is lowered from ½* Vcc even a little.

If "1" is read out in the state in which the P-channel transistor MP1 has been turned on, since the selector signal line 40 is at the "H" logic level as shown in FIG. 3(e), the P-channel transistor MP1, the transistor MN6 and the memory transistor MN11 are connected in series. Since the memory transistor MN11 is in a floating state, and the P-channel transistor MP1 and the memory transistor MN11 have been turned on at that time, the electric potential of the input signal line 34 and the bit line 37 rise up to Vcc as shown in FIG. 3(h) and FIG. 3(i). Since the electric potential of the input signal line 34 is pre-charged to ½* Vcc, the threshold value of the three-state buffer 44 in the sense amplifier circuit 45, also in this case, "1" is immediately read out from the output 38 of the circuit 45 if the electric potential of the input signal line 34 rises from ½* Vcc even a little; therefore there is no need to wait until the predetermined electric potential arrival time 51 has passed, which the conventional timer device needs.

In the aforementioned embodiment, the threshold value of the three-state buffer 44 is set at ½* Vcc, but the identical advantages can be obtained by setting the threshold level of the buffer 44 at an arbitrary level between a little lowered level from ½* Vcc of the bit line 36 at the time of reading out "0" and the power supply voltage Vcc.

It will be appreciated from the foregoing description that, according to the first aspect of the present invention, the semiconductor memory device is designed to pre-charge the electric potential of a selected bit line up to predetermined electric potential, and to judge the electric potential of the selected bit line on the basis of the predetermined electric potential as a threshold value after the pre-charge, and consequently, the memory device has the advantage that the judging time of the sense amplifier circuit thereof can greatly be shortened when information is read out from the semiconductor memory device to enable high-speed read-out.

Furthermore, according to the second aspect of the present invention, the semiconductor memory device is designed to be provided with a second bit line separated from bit lines, to which memory cells are connected, for pre-charging of the memory device, and to fix the bit lines at the ground electric potential during a predetermined period while the second bit line is connected to a power supply, and further to connect a selected bit line to the second bit line during a second predetermined period following after the predetermined period, and consequently, the memory device has the advantage that the decrease of the read-out speed of data therefrom can be restrained to the minimum quantity even if the capacitance of bit lines is increased by the increase of the memory capacity of the memory device in the case where integrated various memory capacities are equipped in accordance with various programs especially in a single chip microcomputer or the like. Accordingly, although the conventional memory device needs. to change read-out circuit, or to provide sense amplifier circuits and selector circuits to each minor capacity memory for preventing the decrease of read-out speed, the memory device of the invention does not need them. And thereby, the memory device of the invention has advantages that the development of the device can be done rapidly, and that the area for the layout of the circuit elements thereof can be reduced.

In addition, the pre-charge voltage of the semiconductor memory device is determined according to the stray capacitance ratio on the second bit line which form is as same as the form of the bit line connected with the memory cell. Therefore, the pre-charge voltage is fixed even if a transistor performance varies when it is produced or temperature varies when the transistor functions, since the capacitance ratio does not vary if the transistor performance varies. Namely, the pre-charge voltage is fixed at all times. In this case, the pre-charge means can always provide a stable voltage.

Furthermore, according to the third aspect of the present invention, the semiconductor memory device is constructed so that a transistor thereof has driving ability to lower the electric potential of a selected bit line than predetermined electric potential in case of reading out one of binary information after the selected bit line has connected with a power supply, and consequently, the memory device has an advantage that the judging time of the sense amplifier circuit thereof can greatly shortened when information of "1" is read-out from the semiconductor memory device to enable high-speed read-out.

Furthermore, according to the fourth aspect of the present invention, the semiconductor memory device is constructed so that each of the memory cells thereof is an N-channel MOS transistor having a grounded source, a drain connected to any of the bit lines thereof, and a gate connected to any of the word lines thereof, and having a threshold value set to be low in case of storing information of "0" or high in case of storing information of "1", and consequently, the electric potential of a selected bit line can rapidly be raised up to a power supply voltage by means of a transistor in the sense amplifier circuit thereof in case of reading out information from a memory cell having a high threshold value, and thereby the memory device has an advantage that the judging time of the sense amplifier circuit can greatly be shortened to enable high-speed read-out.

While a preferred embodiment of the present invention have been described using specific terms, such description is for illustrative purposes only, and it is to be understood that changes and variations may be made without departing from the spirit or scope of the following claims.

What is claimed is:

1. A semiconductor memory device comprising:

word lines;

first bit lines;

a plurality of first memory cells, each first memory cell being provided at a respective intersection of one of the word lines and one of the first bit lines and having a size;

a bit line selecting circuit for selecting one of the first bit lines;

pre-charging means for pre-charging one of the first bit lines selected by the bit line selecting circuit to a predetermined electrical potential, the pre-charging means including a first switching circuit for fixing the first bit lines at ground potential for a first period and for disconnecting the first bit lines from the ground potential during periods other than the first period, a second bit line separate from the first bit lines, a second switching circuit for connecting the second bit line to a power supply voltage during the first period, second memory cells provided at respective intersections of the word lines and the second bit line and having substantially the same size as the first memory cells, and a connecting circuit for connecting the first bit line selected by the bit line selecting circuit with the second bit line during a second period;

a transistor for connecting the first bit line selected by the selecting circuit to a power supply after disconnecting the pre-charging means from the first bit line selected by the selecting circuit; and an output buffer circuit for indicating an electrical potential of the first bit line selected by the selecting circuit in response to the predetermined electrical potential as a threshold value after the first bit line selected by the selecting circuit is connected to the power supply.

2. The semiconductor memory device according to claim 1, wherein the transistor is configured to lower the electrical potential of the first bit line selected by the selecting circuit below the predetermined electrical potential when reading out binary information after the first bit line selected by the selecting circuit is connected to the power supply.

3. The semiconductor memory device according to claim 1, wherein each of the plurality of first and second memory cells comprises an N-channel MOS transistor having a grounded source, a drain connected to one of the first bit lines and to the second bit line, and a gate connected to one of the word lines, and wherein each of the memory cells has a threshold value set low when storing a logic 0 and high when storing a logic 1.

* * * * *